(12) United States Patent
Kneissl et al.

(10) Patent No.: US 6,750,120 B1
(45) Date of Patent: Jun. 15, 2004

(54) METHOD AND APPARATUS FOR MOCVD GROWTH OF COMPOUNDS INCLUDING GAASN ALLOYS USING AN AMMONIA PRECURSOR WITH A CATALYST

(75) Inventors: Michael A. Kneissl, Mountain View, CA (US); David W. Treat, San Jose, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 10/317,762

(22) Filed: Dec. 12, 2002

(51) Int. Cl.$^7$ .............................................. H01L 21/20
(52) U.S. Cl. ...................... 438/479; 438/483; 117/104; 427/255.34
(58) Field of Search ....................... 438/22–47, 479–509

(56) References Cited

U.S. PATENT DOCUMENTS 6,471,769 B2 * 10/2002 Hashimoto et al.

2002/0034467 A1 * 3/2002 Otsuka et al.

OTHER PUBLICATIONS

Sato, et al., "Room Temperature Operation of GaInNAs/ GaInP Double Heterostructure Laser Diodes Grown by Metalorganic Chemical Vapor Deposition", *Japan Journal of Applied Physics*, May 1997, Part 1, No. 5A, pp. 2671–2675.

Ougazzaden et al., "Metal Organic Vapor Phase Epitaxy Growth of GaAsN on GaAs Using Dimethylhydrazine and Tertiarybutylarsine", *Applied Physics Letters*, 70, (21) May 26, 1997, pp. 2861–2863.

* cited by examiner

Primary Examiner—Savitri Mulpuri
(74) Attorney, Agent, or Firm—Kent Chen

(57) ABSTRACT

A method of using ammonia to form a GaAs alloy with nitrogen atoms is described. The method includes the operation of introducing ammonia with an agent to assist in the breakdown of the ammonia into a reaction chamber with the GaAs film. Agents that are described include radiation as well as compounds that include aluminum.

12 Claims, 5 Drawing Sheets

METHOD AND APPARATUS FOR MOCVD GROWTH OF COMPOUNDS INCLUDING GAASN ALLOYS USING AN AMMONIA PRECURSOR WITH A CATALYST

CROSS REFERENCE TO RELATED APPLICATIONS

The present invention is related to co-pending application "A Method and Apparatus for MOCVD Growth of Compounds Including GaAsN Alloys Using an Ammonia Precursor and Radiation" by Michael Kneissl Ser. No. 10/317, 581, filed on the same day and assigned to the same assignee which is hereby incorporated by reference in its entirety.

FIELD OF THE INVENTION

The invention relates to the field of semiconductor processing. More specifically, the invention relates to forming a nitrogen containing group III-arsenide compound semiconductor using ammonia as a precursor.

BACKGROUND OF THE INVENTION

Long wavelength lasers, lasers that emit light in wavelengths between 1.3 micrometers and 1.6 micrometers, are highly desirable for telecommunication system use because at these "telecom wavelengths", a "wavelength window" exists where light absorption in optical fibers is minimized. As telecommunications increasingly rely on optical signal transmission, these long wavelength lasers have become increasingly important.

Most optoelectronic components in the telecom wavelength range are grown on InP substrates. An InP substrate is preferred because the substrate easily lattice matches with high indium composition InGaAs films used in the fabrication of devices that emit 1.3–1.6 micron wavelength light. However, high substrate costs and low device yields makes InP-based optoelectronic devices rather expensive. Devices based on GaAs substrates would be much cheaper, but the difference in lattice constant normally prevents the growth of InGaAs with high In compositions (~50% indium mole fraction is preferred to achieve relevant telecom outputs) on GaAs substrate.

The bandgap in a semiconductor laser determines the frequency of light output by a semiconductor laser. Recently it has been demonstrated that by incorporating small amounts (fraction of a percent to a few percent) of nitrogen into the InGaAs film, the band gap of InGaAs alloys grown on GaAs substrate can be reduced thereby shifting the light emitted by the resulting devices to longer wavelengths. Indium Gallium Arsenide Nitride alloys have been found to be excellent semiconductor materials for fabricating the active region of VCSELS or other long-wavelength optoelectronic devices (e.g. edge-emitting laser, photodetectors or solar cells). Using elementary nitrogen as a group V source and a Molecular Beam Epitaxy (MBE) process, several groups have fabricated InGaAsN based lasers that output 1.3 micrometer wavelength light. See, M. Kondow et al., Jpn. J. Appl. Phys., Vol. 35, 1273 (1996) and M. Kondow, S. Natatsuka, T. Kitatani, Y. Yazawa, and M. Okai, Electron. Lett. 32, 2244 (1996). However, MBE is a slow growth technique and therefore not well suited to mass production of high volume optoelectronic devices such as VCSELs, egde-emitting lasers or solar cells.

Metal Organic Chemical Vapor Deposition (MOCVD) is a suitable technique for volume production of InGaAsN lasers. However, the high growth temperatures and surface chemistry of MOCVD results in inefficient incorporation of elemental nitrogen (N) in the InGaAsN material. To increase the incorporation efficiency of Nitrogen in the InGaAsN, the Nitrogen is typically introduced in a dimethylhydrazine (DMHy) form as described in J. Koch, F. Hohnsdorf, W. Stolz, Journal of Electronic Materials, Vol. 29, 165 (2000) and A. Ougazzaden et al., Appl. Phys. Lett. 70, 2861 (1997) which are hereby incorporated by reference. Large oversupplies of DMHy are used to achieve sufficient amounts of nitrogen in the InGaAsN structure.

The use of large quantities of DMHy as a nitrogen source has two major disadvantages. The first disadvantage is high cost. DMHy is expensive, current costs for 100 grams of DMHy is approximately $5000. A second disadvantage of using DMHy as a Nitrogen source is the relatively high impurity levels that often exist in commercially available DMHy. High impurity levels are possibly one reason why MOCVD grown InGaAsN films are often inferior to MBE grown films.

Thus a better source of Nitrogen for forming InGaAsN structures is needed.

SUMMARY OF THE INVENTION

An improved nitrogen source to form a sample including both nitrogen and gallium-arsenide is described. In the method, ammonia and a source of gallium and a source for arsine is introduced into the reaction chamber. The ammonia is decomposed releasing nitrogen atoms. A catalyst may be used to facilitate ammonia decomposition. The released nitrogen atoms, the gallium and the arsine together form a film including both nitrogen, gallium and arsine.

DETAILED DESCRIPTION

An improved method of decomposing ammonia to provide a source of nitrogen to form a sample including both nitrogen, gallium and arsenide is described. The method is applicable to various semiconductor growth processes, however, the most important semiconductor process for which the described method may be used is in a MOCVD process. The details of the MOCVD process are described in "Organomtallic Vapor-phase Epitaxy: Theory and Practice" by G. B. Stringfellow, published by Academic Press (1989), which is hereby incorporated by reference.

Figure 1:
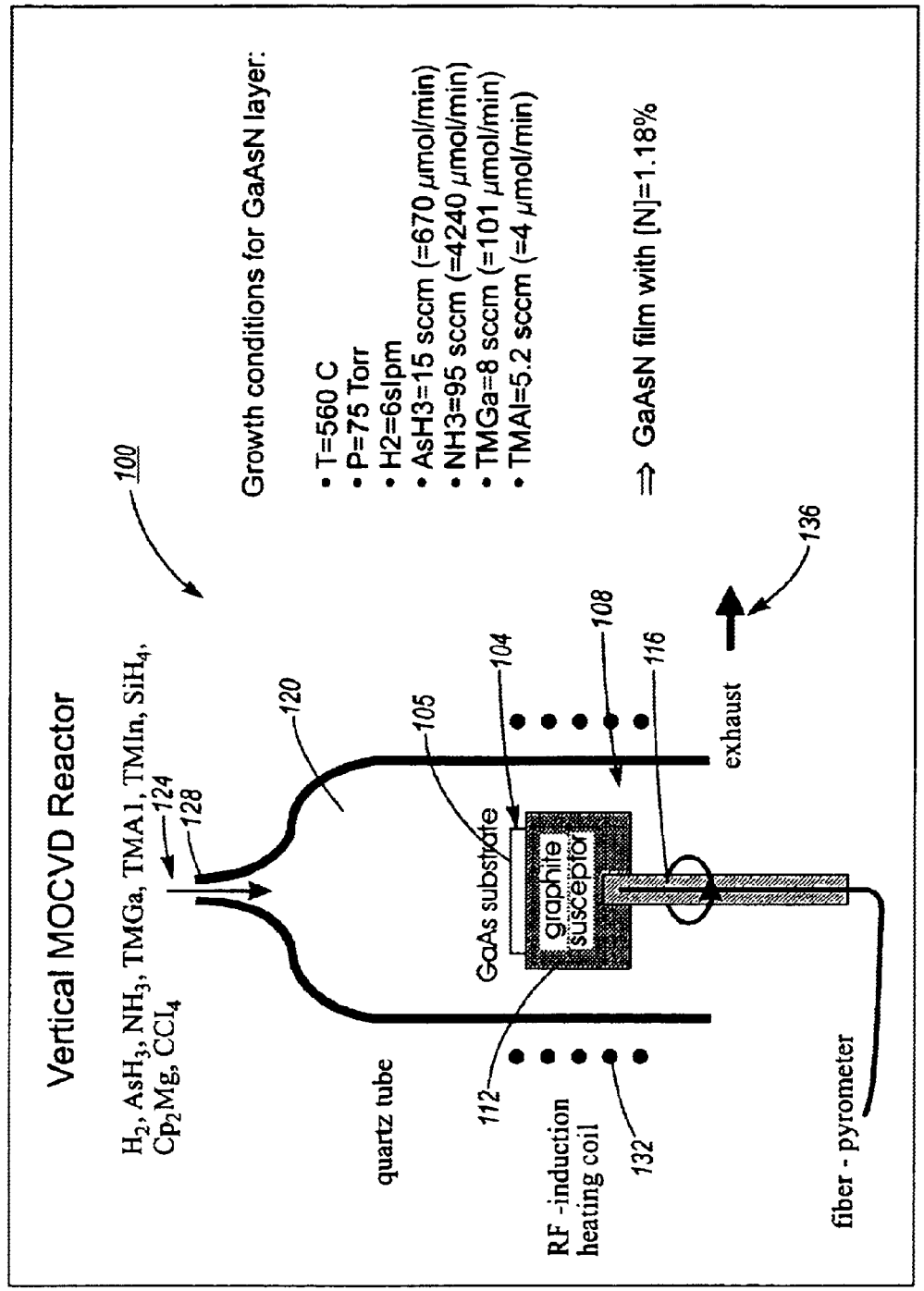
FIG. 1 shows a MOCVD system configured to use ammonia as a nitrogen source.

FIG. 1 shows a MOCVD system 100 that uses ammonia gas as a nitrogen source to form an InGaAsN active layer of an optoelectronic device (e.g. VCSEL, edge-emitting laser, or solar cell). In FIG. 1, a film 105 of InGaAsN is grown on a GaAs substrate 104, supported by support structure 108. The support structure 108 includes a graphite suspector 112 that rotates on a fiber-pyrometer 116. The rotational motion promotes even growth of InGaAsN film 105. A reaction chamber 120, typically made from quartz, substantially encloses the film 105 and the substrate 104 enabling tight control over environmental conditions around the film 105. One controlled condition includes maintaining a vacuum within chamber 120 substantially below atmospheric pressure, typically below 100 Torr. Gas flow 124 entering and exiting the reaction chamber is also tightly controlled.

In the illustrated embodiment, ammonia gas, along with other gases used to form the film, travels through gas inlet 128 into chamber 120. The mixture of gases depends on the structure being formed. Heating source 132, in one example, a RF-induction heating coil, raises the temperature within chamber 120 to a temperature that facilitates growth of the film. Typical temperature ranges are between approximately 400 and 750 degrees centigrade. When fabricating an indium gallium arsenide film, temperatures around 560 degrees centigrade allow for a good growth rate with good structural and electronic properties. Gas exhaust 136 permits venting of un-used gases and leftover reactant products. The constant flow of gases from gas inlet 128 to gas exhaust 136 allows tight control over the composition of the gas mixture in chamber 120.

The concentration of gases input into chamber 120 depends on the desired composition of the substrate being formed. When InGaAsN is formed using ammonia gas, high concentrations of ammonia gas, typically constituting over 50% of the gas flow into the chamber, compensates for the low overall incorporation efficiency of Nitrogen in MOCVD growth of InGaAsN. Typically, the ratio of $[NH_3]$ to $[AsH_3]$ during growth of InGaAsN ranges between 5:1 and 20:1.

A second problem with using ammonia gas as a nitrogen source is the slow decomposition rate of ammonia at low temperature. Raising the temperature above 700 degrees centigrade may cause ammonia pyrolysis resulting in sufficient decomposition of ammonia to provide a needed supply of free nitrogen atoms; however, such high temperatures are undesirable for InGaAs material growth. Instead, one embodiment of the invention uses a catalyst to accelerate the ammonia decomposition rate. In one embodiment of the invention, the catalyst is a chemical catalyst, typically a metal organic, such as trimethlyaluminium (TMAl).

Figure 2:
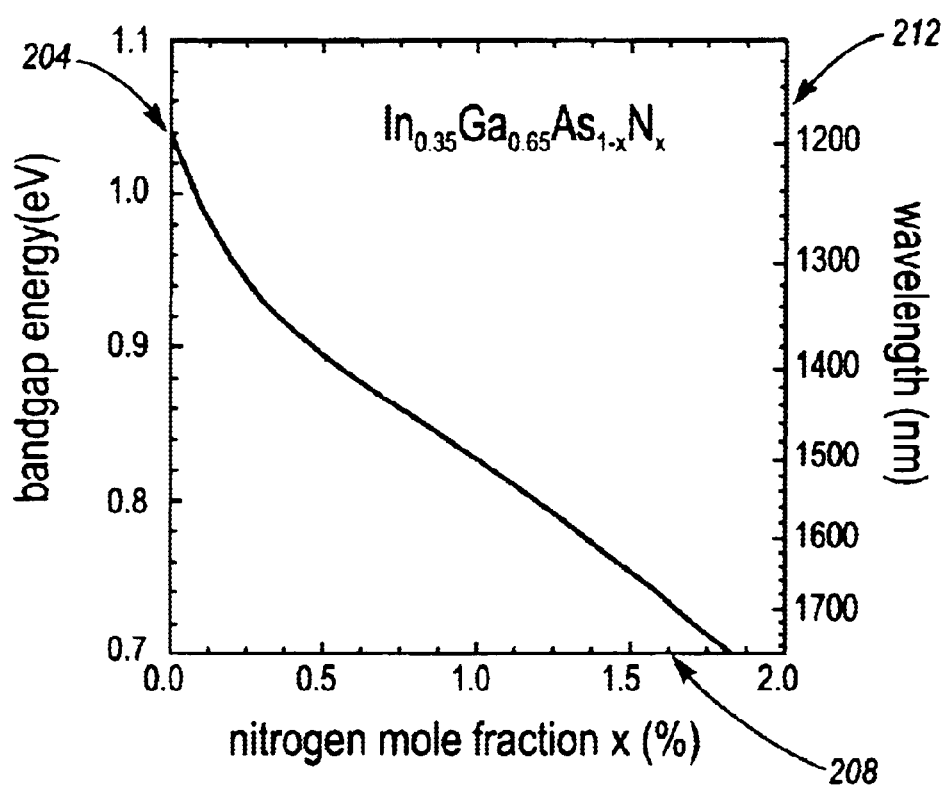
FIG. 2 is a graph that shows the effect of different nitrogen concentrations on the bandgap energy and on the emission wavelength of a laser.
Figure 3:
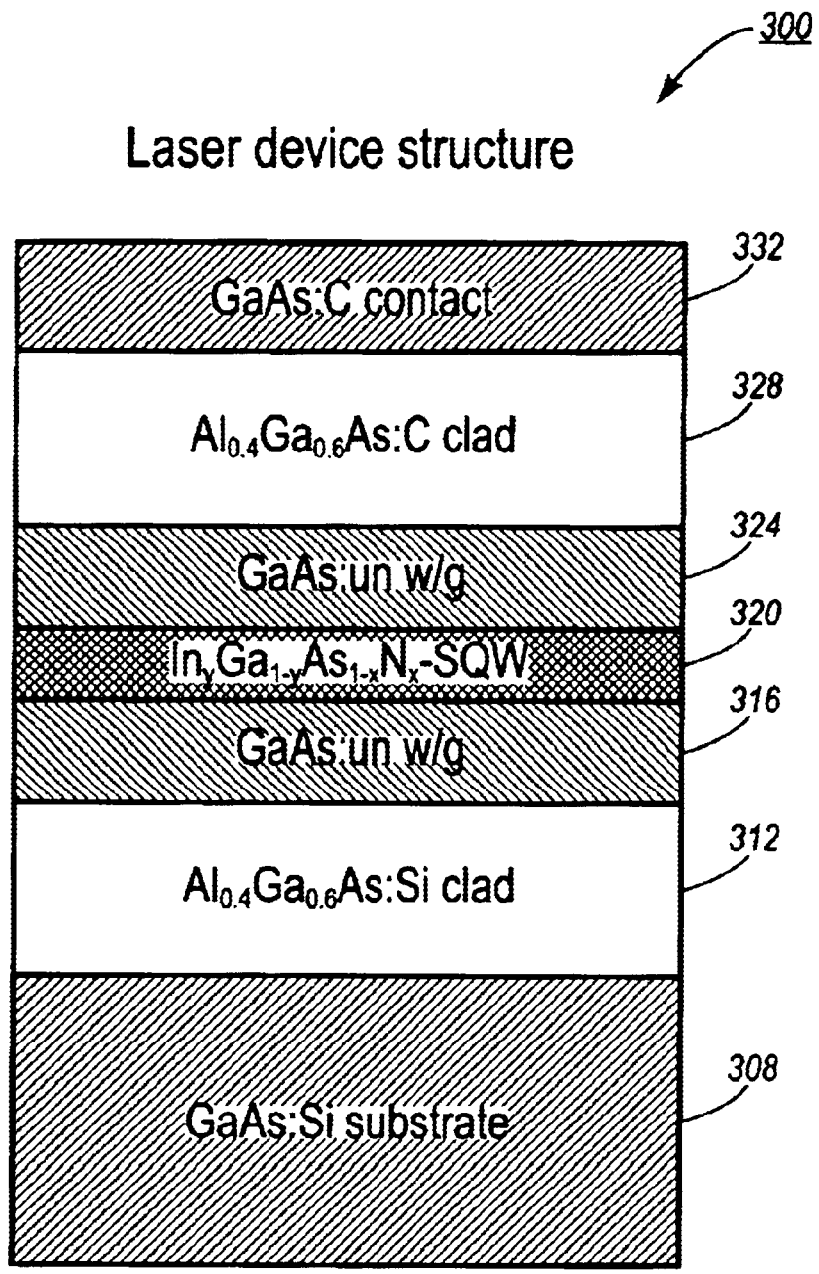
FIG. 3 shows an edge-emitting laser structure with an InGaAsN active region formed using ammonia as a nitrogen source.

FIG. 3 shows a typical InGaAsN laser device structure 300. FIG. 2 is a graph that illustrates the changes in laser emission wavelength as a function of changing nitrogen mole fraction in the active region of the laser device structure. In FIG. 2, the nitrogen content in the active regions along axis 208 is plotted against the bandgap energy of the active region represented along axis 204. The large bowing parameter of InGaAsN alloys (bowing parameter of approximately 18–20 eV for Nitrogen concentrations below 2%) allows significant band gap energy reductions to be achieved by adding small amounts of nitrogen (y<2%) in $InGaAs_{1-y}N_y$ alloys.

The wavelength of light output by active devices fabricated from InGaAsN is plotted on axis 212. As can be seen from the graph, increases in wavelength output is directly related to reduced bandgap energy 204. Reductions in bandgap energy 204 may be achieved by increasing nitrogen content in the film. Thus, one important reason for incorporating nitrogen in the active layer of a semiconductor laser is to reduce the bandgap energy and thereby increase the wavelength output by the active device formed from the GaAs substrate. Reducing the bandgap enables the fabrication of semiconductor lasers that output light wavelengths longer than 1.3 micrometers, preferably between 1.3 and 1.55 micrometer.

In order to facilitate decomposition of the nitrogen, a chemical catalyst, usually including aluminum, is used. One problem with chemical catalysts that include aluminum is that the aluminum itself forms an alloy with GaAs. Increasing Al composition in the AlGaAs alloy increases the aluminum gallium arsenide film bandgap. However, the decrease in band gap due to the incorporation of nitrogen is larger than the increase in bandgap due to the incorporation of Al in the film. Thus the overall effect is that the increase in bandgap due to the aluminum merely lessens the overall decrease in bandgap due to the nitrogen. To further minimize the effects of the aluminum other catalysts that do not contain aluminum may be substituted. One example of such a catalyst is Trimethylantimony the ratio of ammonia to organic metal compound catalyst is greater than 100:1.

One example of a gas mixture that has been successfully used in a MOCVD reaction chamber to form a GasAsN film with a 1.18% nitrogen composition includes: a concentration of $H_2$ at 6 slpm combined with $AsH_3$ at 15 sccm (670 micromol/min), $NH_3$ at 95 sccm (4240 micromol/min), TMGa at 8 sccm (101 micromol/min) and TMAl (trimethylaluminum) at 5.2 sccm (4 micromol/min). In the MOCVD growth process, Hydrogen (H2) serves as the carrier gas transporting the different metal organic (MO) compounds from the bubbler into the chamber. $AsH_3$ gas provides the arsine component to the compound; $NH_3$ gas provides the nitrogen component to the compound; and the metal organic (MO) TMGa provides the gallium component to the GaAs compound semiconductor film.

TMAl serves as a catalyst, enhancing the nitrogen incorporation in the InGAsN film. The TMAl also causes incorporation of some aluminum into the film forming an alloy with gallium, indium, nitrogen. As previously discussed, other catalysts may be substituted for TMAl to avoid aluminum incorporation. Typical flow ranges for $H_2$ are in the range of 2 to 10 slpm, $AH_3$ flow rates are in the range of 5 sccm to 200 sccm, TMGa flow rate are in the range from 1 sccm to 100 sccm and TMAl flow rates are in the range between 1 sccm to 100 sccm. During formation of the GaAsN film, the temperature was maintained at 560 degrees C. while the pressure within the chamber was maintained at 75 Torr.

Figure 4:
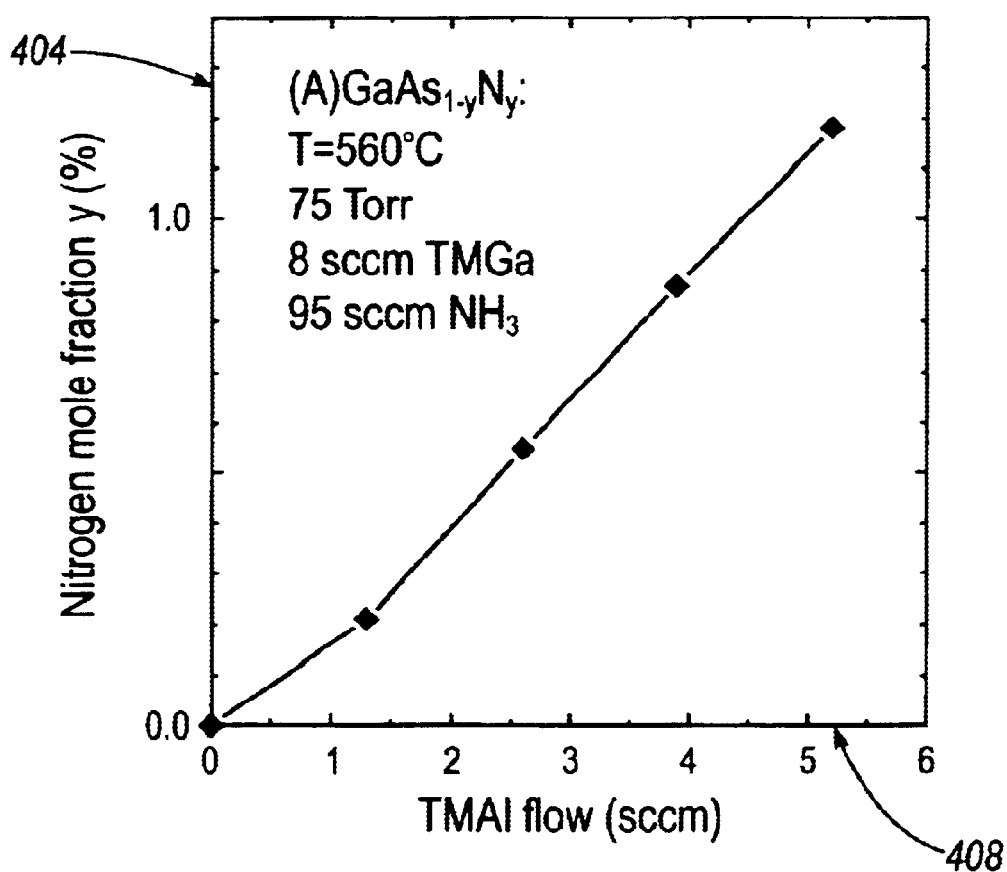
FIG. 4 shows a graph that shows the effect of changing catalyst concentrations on the nitrogen mole fraction deposited in an active layer.

Increases in the nitrogen concentration in the GaAsN films may be achieved by increasing the catalyst concentration. For example, FIG. 4 plots the mole fraction of nitrogen in a GaAsN films along axis 404 as a function of the flow rate of a metal organic catalyst (TMAl) plotted along axis 408. FIG. 4 assumes formation in a MOCVD process using a constant flow rate of ammonia Alternatively the flow rate of ammonia can be increased to increase the nitrogen content in the InGaAsN films.

As previously described, one problem with chemical catalysts is that the catalyst itself may form undesirable alloys with GaAs. Using TMAl (trimethylaluminum) as a catalyst produces undesirable aluminum gallium arsenide compounds. Instead of chemical catalysts, one embodiment of the invention uses a radiation source 150 that emits short wavelength light to enhance the decomposition of the ammonia of the invention. Use of a radiation as a catalyst can either reduce or altogether eliminate the use of chemical catalysts and the associated alloy formation. The light radiation is at a predetermined frequency easily absorbed by the ammonia, typically the frequency ranges between 200–350 nanometers. Typical radiation sources generating the desired light frequency output include excimer laser sources or frequency tripled or frequency quadrupled solid state laser sources such as Nd:YAG lasers.

Figure 5:
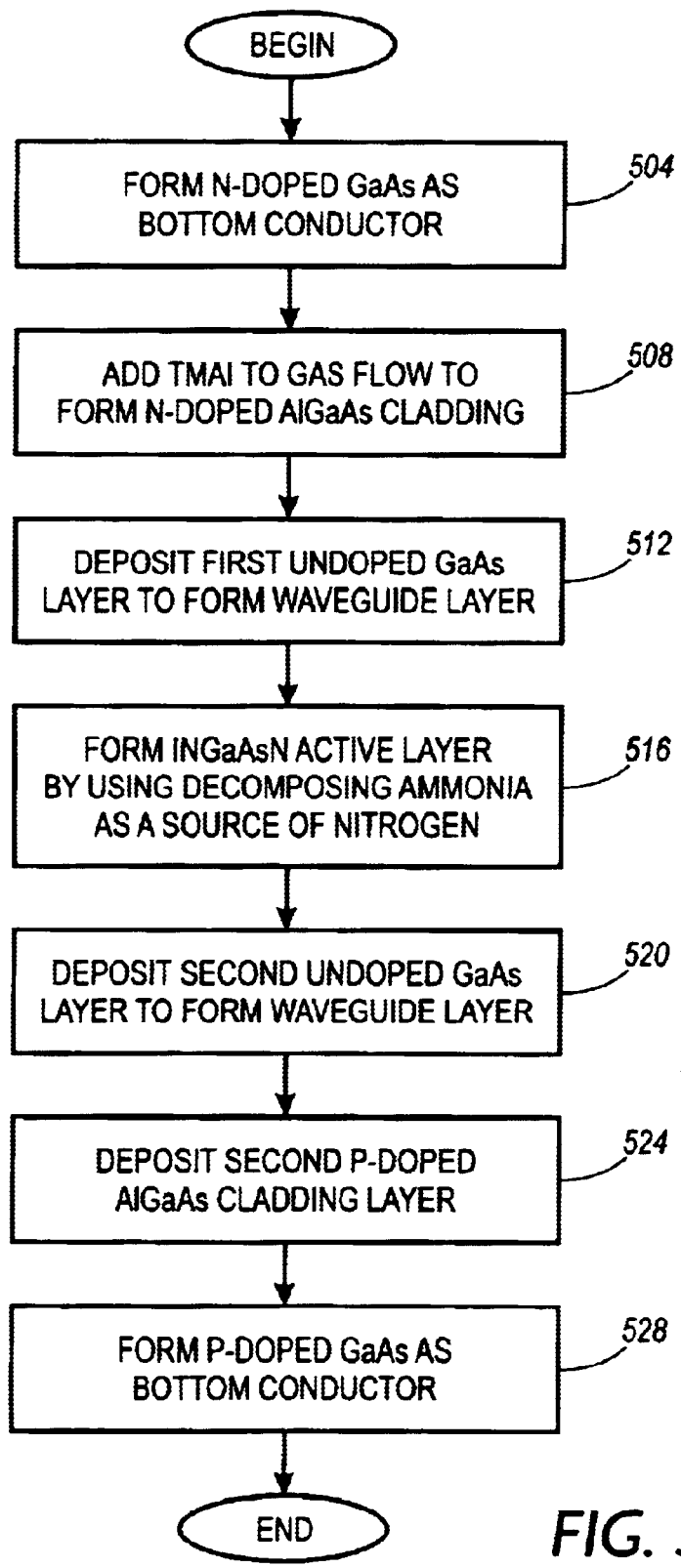
FIG. 5 is a flow chart that describes the operations involved in formation of the semiconductor laser of FIG. 3.

FIG. 5 is a flow chart that describes using a MOCVD process to form the laser structure of FIG. 3. In block 504, GaAs is formed on a GaAs substrate 105 by combining $AsH_3$ and TMGa in a reaction chamber. The GaAs is positioned on a graphite suspector 112 serves as a substrate for the formation of an InGaAsN layer. The GaAs substrate of FIG. 3 serves as a bottom conductor or contact for the laser structure. The GaAs layer grown on top of the GaAs substrate is typically doped n-type. One method of achieving n-doping is uses $SiH_4$ as a dopant source to provide Si-dopants. The GaAs layer is typically grown at around 735 degree Celsius.

In block 508, an aluminum containing gas such as TMAl is added to the $AsH_3$ and TMGa gas flows to form an AlGaAs cladding layer over GaAs substrate 308 of FIG. 3. The AlGaAs layer grown on top of the GaAs layer is also n-doped using $SiH_4$ as a dopant source to provide Si dopant. In alternative embodiments, other dopant materials such as germanium may also be used.

The AlGaAs layers serve as cladding layer surrounding active region 312 of FIG. 3. The active region is formed by depositing an undoped Gas waveguide layer 316 in block 512 followed by deposition of an InGaAsN square quantum well layer 320 in block 516. In one fabrication condition, the GaAs waveguide layer is grown at approximately 640 degree Celsius and the temperature is lowered to around 560 degree Celsius during growth of the InGaAsN layer. Decomposed ammonia provides the nitrogen atoms used in forming the InGaAsN layer. In block 520, the temperature is raised again to approximately 640 degrees as a second undoped GaAs waveguide layer 324 is deposited over square quantum well 320. The undoped GaAs layers 316, 324 form the walls of the square quantum well and serves also as a waveguiding layers for the separate confinement heterostucture.

A second AlGaAs cladding layer 328 is deposited in block 524. The second AlGaAs layer grown is Mg- or C-doped using $Cp_2Mg$ or $CCl_4$ as a dopant source to form a p-doped layer. In one embodiment, the AlGaAs layer is grown at approximately 735 degree Celsius. The higher growth temperature during the growth of the second AlGaAs layer also causes an annealing of the InGaAsN film. In an alternate embodiment, the InGaAsN film could be annealed by rapid thermal annealing (RTA) in a furnace under nitrogen atmosphere and with a GaAs cap to achieve an equivalent effect. An example annealing condition is to anneal the substrate at 750 degree Celsius for 3 minutes.

The second AlGaAs cladding layer together with the first cladding layer forms a waveguide structure that provides optical confinement of the transverse optical mode. In block 528, a second GaAs contact 332 is deposited over the cladding layer. The second GaAs contact layer may be formed around 640 degrees Centigrade and is usually p-doped with Mg—and/or Carbon—using $Cp_2Mg$ and/or $CCl_4$ as a dopant source. Ohmic metal contacts are deposited on the n-type GaAs substrate (e.g. AuGe) and the p-type GaAs contact layer (e.g. Ti/Pt/Au). The n- and p-type contacts couple to a current source to supply a forward current to the laser structure. Laser facets are cleaved along the GaAs (110) cleavage planes to form a laser cavity and provide optical feedback.

Although the illustrated structure describes one embodiment of a traditional edge-emitting laser structure, many variations are possible. For example, some structures may utilize GaAs/AlAs quarter wavelength stacks instead of AlGaAs cladding layers. The GaAs/AlAs quarter wavelength stacks act as distributed Bragg reflectors (DBR) and form a laser cavity perpendicular to the substrate plane. The optical feedback from the DBR mirrors forms a vertical cavity surface emitting laser structure (VCSEL). In addition a transparent ITO contact instead of a metal p-contact could be used. A transparent contact allows direct current injection into the active region while simultaneously permitting light output through the transparent contact.

The preceding description includes many parameters, descriptions and other details that should not be interpreted to limit the scope of the invention. Such details are provided to facilitate understanding of the invention and should not be construed as a necessary part of the invention. For example, although the detailed description describes the use fabrication of a edge-emitting structure, the concepts of the invention may also be used to form VCSEL lasers, other passive devices such as photodetector devices or solar cells, light detection systems, and electronic devices, like HBT or HEMT structures. Also, a number of details such as temperatures used during formation have been provided to facilitate fabrication, but it should be understood that other temperatures may be used and still within the scope of the invention. Thus, the scope of the invention should only be limited by the claims as set forth below.

What is claimed is:

1. A method forming a semiconductor film including gallium, arsenic and nitrogen, the method comprising the operations of:

introducing gallium and arsenic and ammonia into the reaction chamber;

introducing an organic metal compound catalyst to facilitate the decomposition of the ammonia, wherein the ratio of ammonia to catalyst is greater than 100:1; and, growing a layer including gallium, arsenic and nitrogen, the nitrogen atoms provided by decomposing ammonia.

2. The method of claim 1 wherein the catalyst is an organic aluminum compound.

3. The method of claim 2 wherein the catalyst is trimethylaluminum or tryethylaluminum.

4. The method of claim 1 wherein the catalyst is an organic antimony compound.

5. The method of claim 4 wherein the catalyst is trimethylantimony.

6. The method of claim 1 wherein the arsenic-containing compound is arsine or tertiarybuthylarsine.

7. The method of claim 1 wherein the gallium-containing compound is an organic gallium compound.

8. The method of claim 5 wherein the gallium-containing compound is trymethylgallium or tryethylgallium.

9. The method of claim 1 wherein ammonia represents more than 50% of the total gas being introduced into the chamber.

10. The method of claim 1 wherein the flow rate of ammonia being introduced into the chamber exceeds 2000 micro-moles per minute.

11. The method of claim 1 wherein the reaction chamber is heated to a temperature between 400 and 750 degrees centigrade.

12. The method of claim 1 wherein arsine is also introduced into the chamber such that the film includes gallium, arsenic and nitrogen, the ratio of $[NH_3]$ to $[AsH_3]$ used to form the film is between 5:1 and 20:1.

* * * * *